(12) United States Patent
Dalla Piazza et al.

(10) Patent No.: US 7,253,554 B2
(45) Date of Patent: Aug. 7, 2007

(54) QUARTZ RESONATOR OF SMALL DIMENSIONS

(75) Inventors: Silvio Dalla Piazza, St-Imier (CH); Thomas Lüthi, Grenchen (CH); Bruno Studer, Riedholz (CH)

(73) Assignee: ETA SA Manufacture Horlogere Suisse, Grenchen (CH)

( * ) Notice: Subject to any disclaimer, the term of this patent is extended or adjusted under 35 U.S.C. 154(b) by 119 days.

(21) Appl. No.: 10/982,790

(22) Filed: Nov. 8, 2004

(65) Prior Publication Data

US 2006/0049722 A1 Mar. 9, 2006

(30) Foreign Application Priority Data

Sep. 3, 2004 (EP) ................... 04104267

(51) Int. Cl.
*H03H 9/215* (2006.01)
(52) U.S. Cl. .................................... 310/370
(58) Field of Classification Search ............... 310/311, 310/320, 370, 369; *H03N 41/08*
See application file for complete search history.

(56) References Cited

U.S. PATENT DOCUMENTS

| | | | |
|---|---|---|---|
| 4,384,232 A | 5/1983 | Debely | |
| 6,346,765 B1 * | 2/2002 | Kikuchi et al. | 310/367 |
| 6,587,009 B2 | 7/2003 | Kitamura et al. | |
| 6,651,498 B1 * | 11/2003 | Kikuchi et al. | 73/504.12 |
| 2002/0089386 A1 | 7/2002 | Kitamura et al. | |

FOREIGN PATENT DOCUMENTS

| | | | |
|---|---|---|---|
| FR | 2 467 487 | | 4/1981 |
| JP | 5360594 | * | 5/1978 |
| JP | 2003-69368 | * | 3/2003 |
| JP | 2004-129181 | * | 4/2004 |
| JP | 2004-200914 A1 | | 7/2004 |
| JP | 2005-291937 | * | 10/2005 |

OTHER PUBLICATIONS

Patent Abstracts of Japan, vol. 002, No. 096 (E-048), Aug. 11, 1978, & JP 53 060594, (Seiko Epson Corp.), May 31, 1978.
Patent Abstracts of Japan, vol. 007, No. 154, Jul. 6, 1983 & JP 58 062917, (Daini Seikosha KK), Apr. 14, 1983.
Patent Abstracts of Japan, vol. 005, No. 040, Mar. 17, 1981 & JP 55 162612 (Citizen Watch Co, Ltd.) Dec. 18, 1980.

* cited by examiner

*Primary Examiner*—Thomas M. Dougherty
(74) *Attorney, Agent, or Firm*—Sughrue Mion, PLLC

(57) ABSTRACT

The invention concerns a piezoelectric resonator (10), intended to be packaged in a case, including a base (12) formed of a first fixing zone (121), a second central mechanical uncoupling zone (122) and a third zone (123) opposite to the first fixing zone. At least two vibrating arms (13a, 13b) extend from said third zone, on each of which at least one groove (141a-144a, 141b-144b) is formed on at least one of the top or bottom faces of the arms. The resonator is characterised in that the base is provided with a hole (15) through the second central mechanical uncoupling zone.

18 Claims, 6 Drawing Sheets

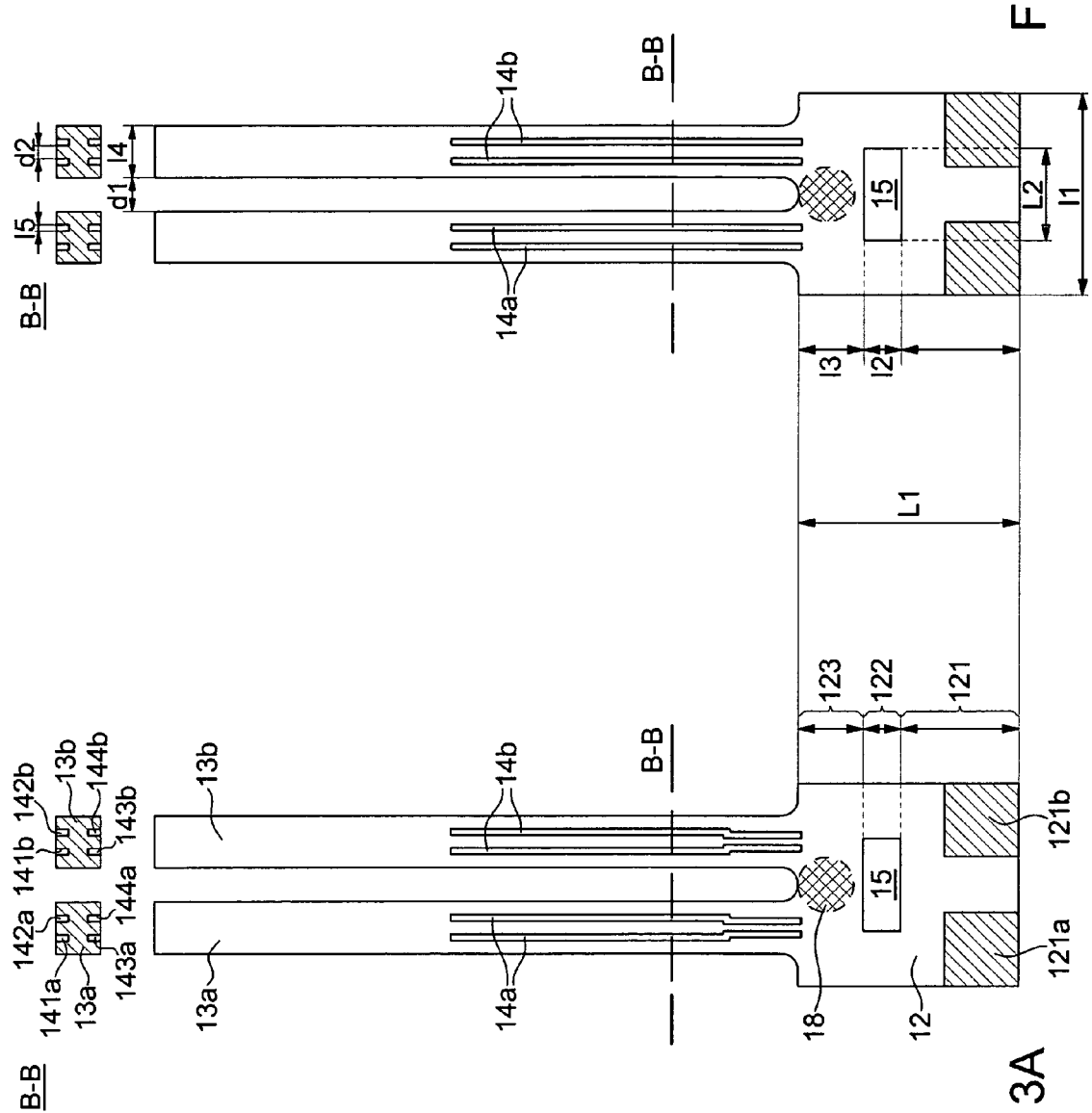

Cross-Section C-C

QUARTZ RESONATOR OF SMALL DIMENSIONS

This application claims priority from European Patent Application No. EP 04104267.2 filed 3 Sep. 2004, the entire disclosure of which is incorporated herein by reference.

FIELD OF THE INVENTION

The present invention concerns, generally, piezoelectric resonators and more specifically, resonators of very small dimensions, which are usually used for making frequency generators, particularly for portable electronic equipment, in numerous fields, such as watchmaking, information technology, telecommunications and medicine.

BACKGROUND TO THE INVENTION

Tuning fork piezoelectric resonators are known in which the electrical excitation field is created in a direction parallel to one of their faces by electrodes, some of which are arranged on said face. Such a tuning fork resonator 1, shown in FIG. 1, includes a base 2 and two vibrating arms 3a and 3b extending from the base. With a view to reducing energy consumption owing to excitation by a more homogenous electrical field, there is known, particularly from FR Pat. No. 2 467 487, which is incorporated herein by reference, to provide at least one groove 4a and 4b on the bottom and/or top faces of each of the arms, such that the arms generally have an H-shaped cross-sectional form, as is visible in the cross-section A-A of FIG. 1.

Although of small dimensions, of the order of a millimeter, such piezoelectric generators are still too bulky in light of the ever increasing demand for miniaturisation of electronic equipment, such as portable telephones or watches.

One solution recommended in the prior art, shown in FIG. 2, and described in more detail in U.S. Pat. No. 6,587,009 consists in providing notches 5a and 5b on the flanks of base 2 of the piezoelectric generator. The main purpose of these notches 5a and 5b is to mechanically uncouple zone 6 of base 2, used to fix resonator 1 in its case, from vibrating arms 3a and 3b. Notches 5a and 5b enable, more specifically, the vibrations, which generate a movement in the zone of shoulders 7a and 7b, to be uncoupled. This mechanical uncoupling between base fixing zone 6 and vibrating arms 3a and 3b enables the size ratio between base 2 and arms 3a and 3b to be reduced and thus the total size of resonator 1 to be reduced without thereby altering the operating mode.

However, such a solutions has certain drawbacks. An analysis of this prior art solution has demonstrated that these notches 5a and 5b do not enable the tuning fork to be uncoupled from thermal stress generated by the lack of thermal tuning of the thermal expansion coefficients, thus resulting in the propagation of a static mechanical stress in a median zone 8 of base 2 located between the two arms 3a and 3b. Moreover, dynamic elastic stress is maximal in this median zone 8. The results of this combination of static mechanical stress varying with temperature and the dynamic elastic stress is an alteration in the features of resonator 1.

One solution for improving the resistance of the resonator to these types of stress is the use of a flexible adhesive agent, like for example conductive silicon adhesives, for mounting the resonator in its case. Nonetheless, such flexible adhesive agents exhibit problems of adherence and resistance to shocks, such a solution is thus undesirable.

Moreover, notches 5a and 5b weaken the mechanical structure of resonator 1, which raises a problem in the event of shocks, and more specifically in the event of lateral shocks. Indeed, when there is a lateral shock, the forces exerted on the whole of resonator 1, i.e. on arms 3a and 3b and on base 2, result in maximum stress at the point of intersection between each notch 5a and 5b and base fixing zone 6.

It is one of the main objects of the invention to overcome the aforementioned drawbacks by making a piezoelectric resonator having, on the one hand, a reduced size as well as an equally reduced energy consumption, and on the other hand, good resistance to the various stresses that the resonator may undergo, as well as good shock resistance.

SUMMARY OF THE INVENTION

Within the scope of the present invention, it has been demonstrated that replacing the notches formed in the base by a hole made in the fixing zone of the resonator and the vibrating arms allows the static thermal stresses to be perfectly uncoupled from the median zone of the base located between the arms, and thus to have no coupling in the dynamic elastic stress zone. This hole also allows the effective length of the arms to be artificially elongated, thus reducing the total size of the resonator for the same resonance frequency. Moreover, lateral shock resistance is reinforced, since the resonator no longer has a weak point in proximity to the fixing zone, while maintaining the same resistance as a solution with notches in the direction perpendicular to the resonator plane.

Thus, according to a preferred embodiment of the invention, the resonator includes a base formed of a first fixing zone, a second central mechanical uncoupling zone and a third zone, opposite the first fixing zone, from which at least two vibrating arms extend, on each of which at least one groove is formed on at least one of the top or bottom faces of the arms, characterised in that the base is provided with a hole through the second central mechanical uncoupling zone.

This type of resonator is generally intended to be packaged in a case. Owing to the advantages obtained by the use of a hole instead of notches, it is possible to further improve shock resistance by selecting a rigid mounting, like for example an epoxy conductive adhesive, for fixing the resonator to its case.

It will also be noted, again for the purpose of improving the resistance of the resonator, that the hole advantageously has a polygonal shape the sides of which are cut so as to minimise visualization of the crystalline planes of the piezoelectric resonator.

Finally, the present invention also concerns a vibrator including a case in which a piezoelectric generator according to any of the embodiments of the invention is rigidly fixed.

BRIEF DESCRIPTION OF THE DRAWINGS

Other features and advantages of the present invention will appear more clearly upon reading the following detailed description of embodiments of the invention, given solely by way of non-limiting examples and illustrated by the annexed drawings, in which:

FIGS. 3A and 3B show a tuning fork piezoelectric resonator having grooves on its arms and a hole in its base, according to two variants of a first embodiment of the invention;

DESCRIPTION OF PREFERRED EMBODIMENTS

Figure 2:
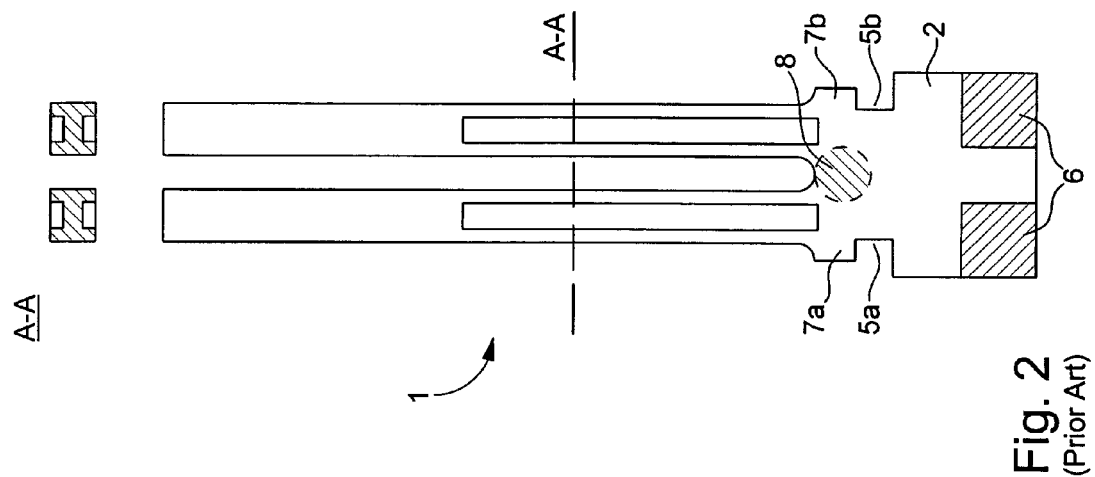
FIG. 2, already described, shows a tuning fork piezoelectric resonator having grooves on its arms and notches on its base, according to the prior art.
Figure 1:
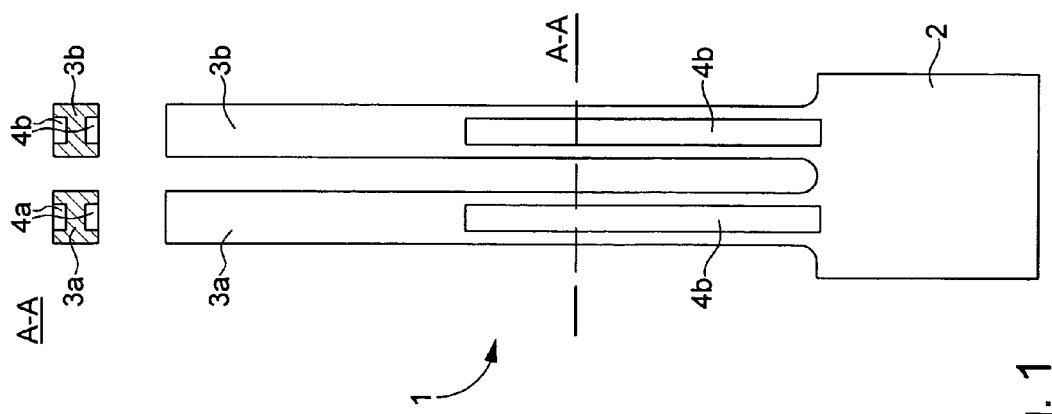
FIG. 1, already described, shows a tuning fork piezoelectric resonator having grooves on its arms, according to the prior art.

As previously mentioned, the present invention concerns a piezoelectric resonator having, on the one hand, reduced power consumption owing to excitation by a more homogenous electrical field and, on the other hand, proper mechanical uncoupling between the base and the arms of the resonator as well as greater shock resistance, particularly to lateral shocks.

FIGS. 3A and 3B show a tuning fork piezoelectric resonator according to two variants of a first embodiment of the invention. Resonator 10 includes a base 12 from which extends two vibrating arms 13a and 13b each having at least one groove 14a, 14b on at least one of the top and/or bottom faces of the arms. In the example shown, along the cross-section B-B, each of arms 13a and 13b advantageously includes two grooves (141a-144a, 141b, 144b) on each of the top and bottom faces.

The use of two small grooves optimises the piezoelectric coupling while maximising the dynamic capacity of the resonator and reducing to a minimum the section of the arms.

For the purpose of having the most resistant structure possible for the arms, a first variant, shown in FIG. 3A provides that the grooves of the same arm arranged on the same face have a reduced spacing between them in the zone of the arms close to base 12 of the resonator.

According to a second simpler variant having satisfactory resistance for the arms, shown in FIG. 3B, the grooves of the same arm on the same face have a constant spacing between them as far as base 12 of the resonator, which has the effect of maximising the desired effect on the dynamic capacity.

By way of additional variants, it will be noted that it is also possible to have only one groove on one face or both faces of each of the arms. Nonetheless, in such case, the spacing between the grooves at the base will preferably be reduced, if one wishes to prevent weakening the mechanical structure of the arms too much.

Still examining FIGS. 3A and 3B, base 12 is broken down into three zones. A first zone 121 called the fixing zone, is used for fixing resonator 10 to a case (not shown) in which the resonator is packaged. The hatched zones 121a and 121b, to which either dots of adhesive or solder spots are applied, represent an example of use of fixing zone 121 for fixing resonator 10 to its case. A second central zone 122 includes a hole 15, which uncouples the static thermal stress from median zone 18 of the base located between the arms, and thus avoids having any coupling in the dynamic elastic stress zone. This hole 15 also allows the effective length of arms 13a and 13b to be artificially elongated, thus allowing the total size of resonator 10 to be reduced for the same resonance frequency. Moreover, resistance to lateral shocks is reinforced, since resonator 10 does not have any point of weakness on the lateral faces of base 12, while maintaining the same resistance in the direction perpendicular to the plane of resonator 10. Finally, a third zone 123 ensures a minimum zone of matter between hole 15 of central zone 122 and vibrating arms 13a and 13b. It will be noted that the hole has a rectangular shape according to the example shown. However, the hole can also have a square shape or other advantageous shapes, certain of which are detailed in relation to FIGS. 5A-5D.

Such resonators are of very small dimensions. Within the scope of the present invention, certain advantageous dimension ratios have been demonstrated. The following dimensions are given by way of example:

| Length of base | L1 | 610 μm |
| Width of base | l1 | 552 μm |
| Length of hole | L2 | 220 μm |
| Width of hole | l2 | 102 μm |
| Width of $3^{rd}$ zone | l3 | 156 μm |
| Width of an arm | l4 | 144 μm |

Thus the resonator preferably has the following dimension ratios:

the ratio of hole width l2 to the base length L1 is comprised between 10 and 50%, and advantageously between 15 and 25%;

the ratio of hole length L2 to base width l1 is comprised between 33 and 75%, and advantageously between 39 and 50%;

the ratio of the $3^{rd}$ zone width to the width of an arm is comprised between 50 and 200%, and advantageously between 80 and 130%.

As mentioned previously, the effect of using two grooves having a constant spacing between them (FIG. 3B) is to maximise the desired effect on the dynamic capacity. By way of example, the following dimensions can be used for the grooves:

| Distance between the arms | d1 | 92 μm |
| Width of the grooves | l5 | 20 μm |
| Spacing between the grooves | d2 | 34 μm |

Advantageously, the ratio of the width of a groove l5 to the width of an arm l4 is comprised between 10 and 30%, and the ratio of the distance between grooves d2 to the width of an arm l4 is comprised between 20 and 30%.

Figure 4A:
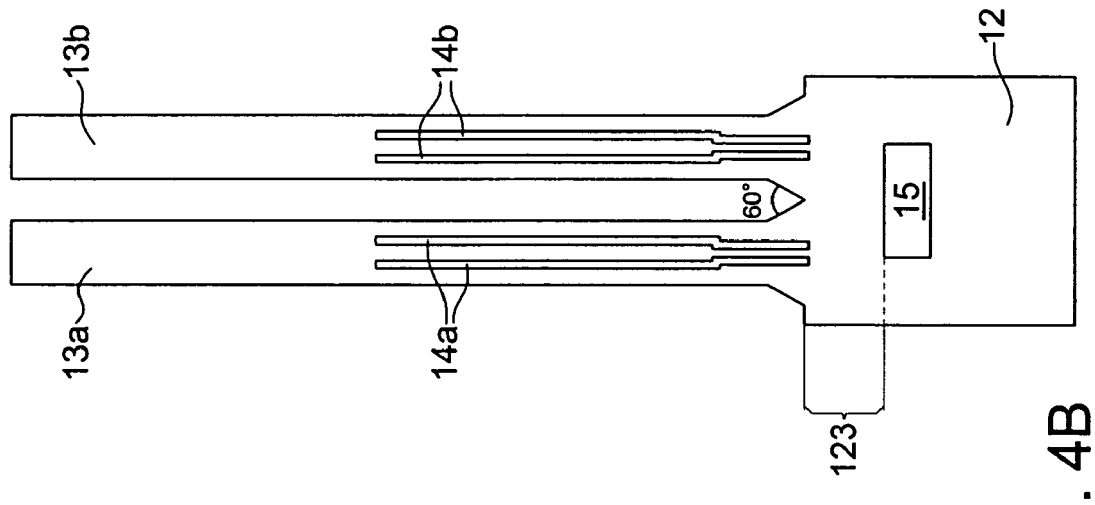
FIGS. 4A and 4B show a tuning fork piezoelectric resonator according to two other variants of the first embodiment of the invention.
Figure 4B:
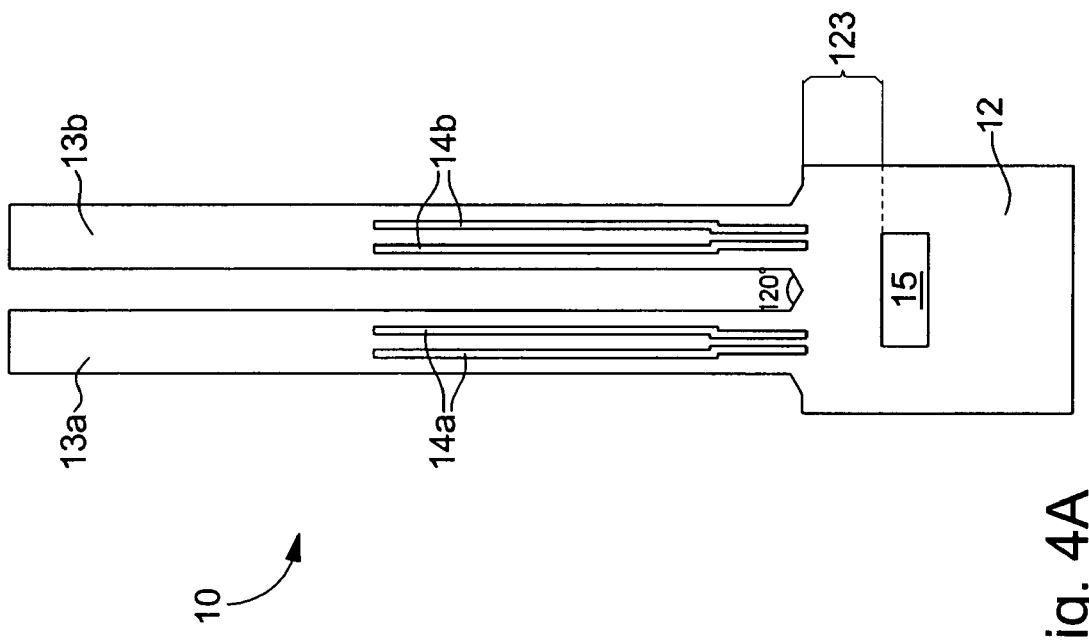

FIGS. 4A and 4B show a tuning fork piezoelectric resonator according to third and fourth variants of the first embodiment. Those elements common to FIGS. 3A and 3B are designated with the same reference numerals.

With a view to further improving the shock resistance of resonator 10, the third zone 123 of base 12 has a cut out portion where arms 13a and 13b are fixed, minimising the visualization of the crystalline planes of the piezoelectric resonator. In the example of a quartz resonator, the cut out portion forms angles of approximately 60° (FIG. 4A) or 120° (FIG. 4B). These 600 or 120° planes correspond to the equivalent crystalline directions of the quartz, which minimises the etch residues originating from the anisotropic etching of the quartz. It is in fact well known that these etch residues, which uncover the crystalline plane intersections, are weak points in the event of a shock.

These two variants have been shown with grooves 14a and 14b having a constant spacing. However, it is clear that all of the variants of the different groove structures able to be used and presented in relation to FIGS. 3A and 3B, can be adapted here.

FIGS. 5A-5D show solely bases 12 of the piezoelectric resonator according to other embodiments of the invention concerning, in particular, the geometry of hole 15 made in the base of resonator 10. Like for the zone located where the arms are fixed to the base of the resonator, it is advantageous to use a hole of polygonal shape, at least two sides of which form an angle minimising the visualization of the crystalline planes during etching. In the example of a quartz crystal, polygons have at least two sides forming an angle of 60° or 120°.

Figure 5A:
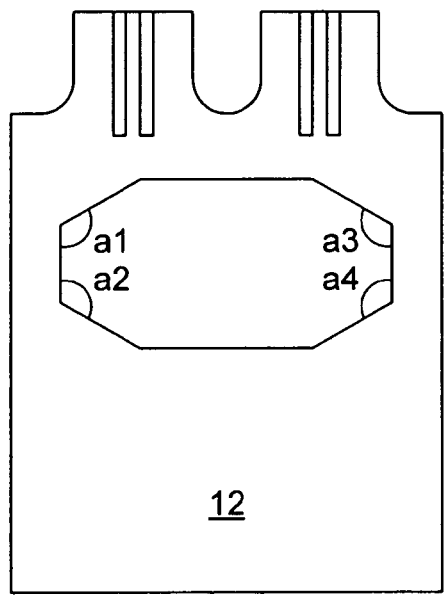
FIGS. 5A-5D show a tuning fork piezoelectric resonator according to other embodiments of the invention.
Figure 5B:
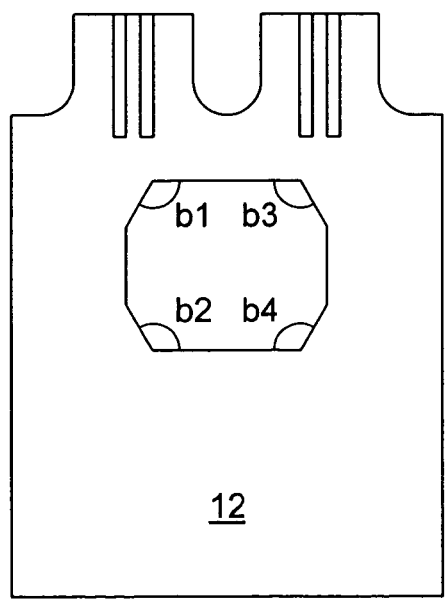

FIG. 5A shows a hole of octagonal shape having 4 angles (a1-a4) of 120°, advantageously, on the side of the lateral flanks of base 12 of the resonator, thus reinforcing resistance to lateral shocks. FIG. 5B shows a variant hole of octagonal shape.

Figure 5C:
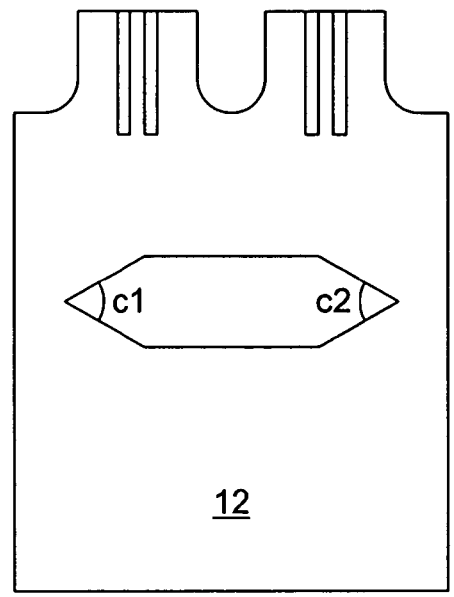
Figure 5D:
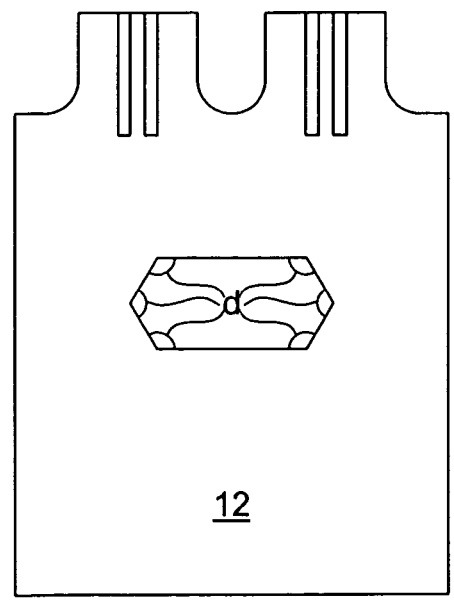

FIG. 5C shows a hole of hexagonal shape having 2 angles (c1-c2) of 60° on the side of the lateral flanks of base 12 of the resonator. FIG. 5D shows an advantageous variant hole of hexagonal shape having 6 angles (d1-d6) of 120°.

Figure 6B:
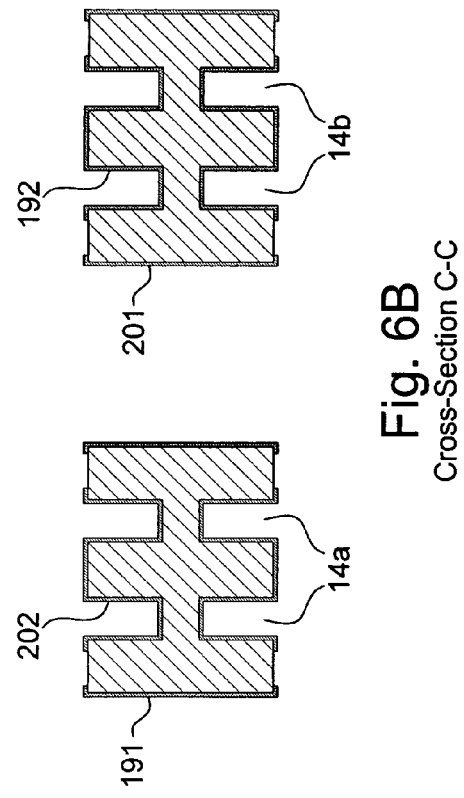
FIG. 6B shows a cross-sectional view of the resonator along line C-C of FIG. 7A.
Figure 6A:
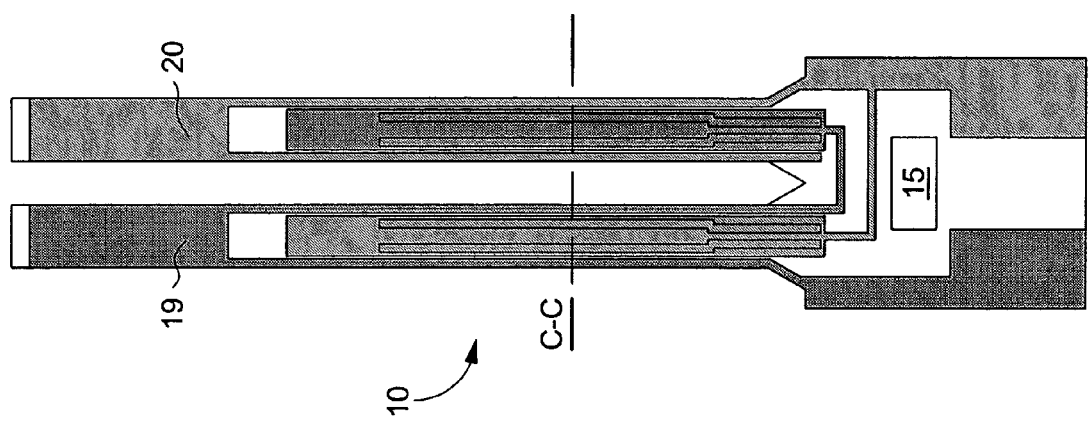
FIG. 6A shows a top view of the resonator showing an example of the electrode arrangement.

FIG. 6A shows a top view of an example arrangement of electrodes 19 and 20 used to electrically excite resonator 10. These electrodes 19 and 20 are obtained by conventional methods, as for example described in U.S. Pat. No. 6,587,009 in conjunction with FIGS. 14 to 17, which is incorporated here by reference.

FIG. 6B shows an enlarged view along cross-section C-C of FIG. 6A. This view shows the advantage provided by the use of grooves. Indeed, the presence of the grooves (141a-144a, 141b-144b) favours the creation of a homogenous electric field along axis X of the crystal. Their role is illustrated by the lines of force of the field created in operation, which are shown on the section of a resonator arm. In this example, the resonator arm includes 2 grooves on each of the bottom and top faces. At the grooves, the lateral part 191, respectively 201 of the electrodes is formed mainly on the edge of the resonator and on a fine strip on the top and bottom faces. The central part 192, respectively 202 of the electrodes is formed for example by a gold deposition, covering the two grooves of the same face and the full zone between said two grooves. The electrodes of the same polarity of the power source are connected to each other via conductive paths that are not shown.

Figure 7:
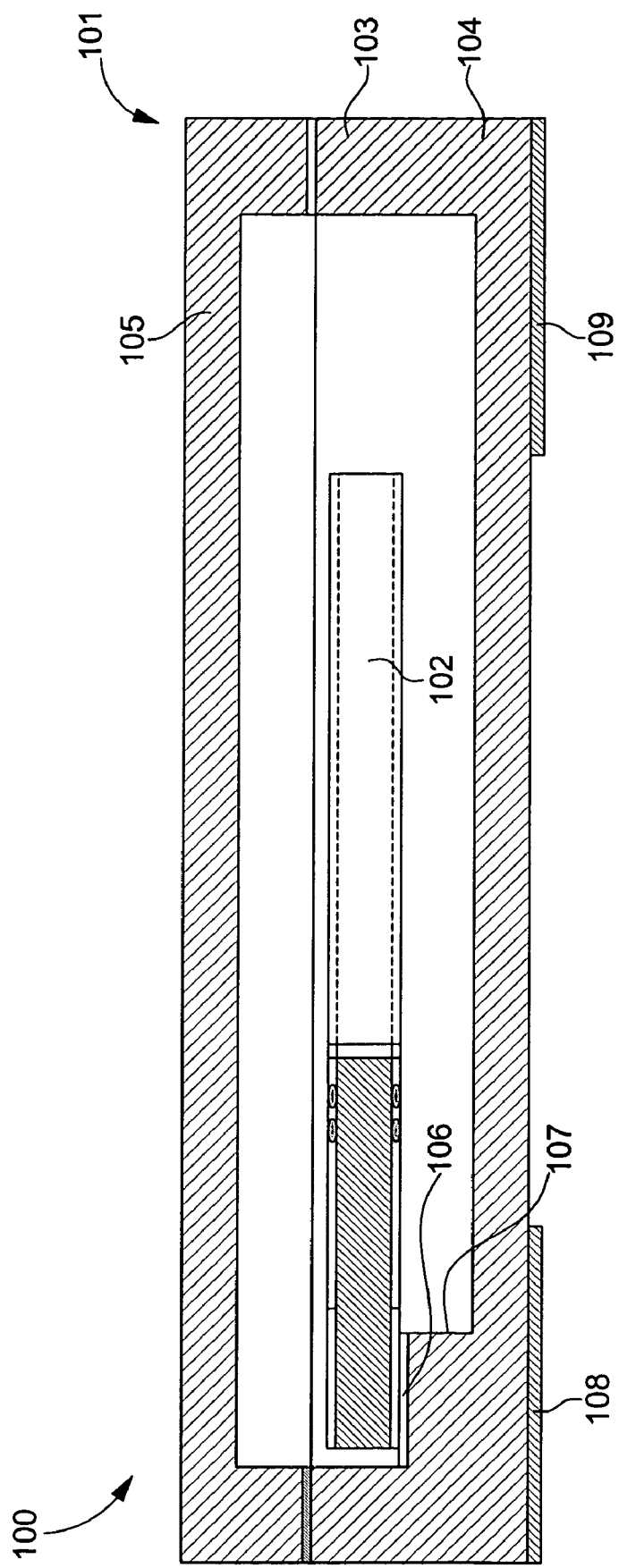
FIG. 7 shows a vibrator including a resonator according to any of the embodiments of the invention.

FIG. 7 shows a vibrator 100 including a piezoelectric resonator according to any of the embodiments presented hereinbefore. This vibrator 100 includes a case 101 in which resonator 102 is fixed. The case can have a cylindrical or parallelepiped shape, or any other compact shape capable of being incorporated while occupying a minimum volume in a portable electronic device, such as a mobile telephone.

According to the example shown in FIG. 7, case 101 of parallelepiped shape includes a main part 103 with a bottom 104 and sides and a cover 105 with an edge that has been vacuum welded, via heating and pressure, using a weld joint for example made of eutectic gold and tin alloy, after resonator 102 has been mounted in case 101.

The resonator is mounted by welding or bonding with a hard conductive adhesive the connection pads, corresponding to electrodes 19 and 20 (in FIG. 7) of the back face onto the corresponding conductive pads 106 provided on a step 107 of the bottom 104 located on a side of the main part of the case, these pads 106 being connected in a manner that is not shown in the drawing, to external contact pads 108 and 109 arranged on the rear face of the bottom. In fact, owing to the advantages provided by the use of a hole instead of notches, it is possible to further improve shock resistance by selecting a rigid fixing method, for example an epoxy conductive adhesive, to fix the resonator to its case.

It will be understood that various modifications and/or improvements evident to those skilled in the art can be made to the various embodiments of the invention described in the present description, particularly by combining the advantages presented in these various embodiments, without departing from the scope of the invention defined by the annexed claims.

What is claimed is:

1. A piezoelectric resonator, packaged in a case, including a base formed of a first fixing zone, a second central mechanical uncoupling zone and a third zone opposite to the first fixing zone, at least two vibrating arms extending from said third zone, on each of which at least one groove is formed on at least one of the top or bottom faces of the arms, wherein the base is provided with a hole through the second central mechanical uncoupling zone, and wherein said hole has a polygonal shape, at least two sides of which form an angle minimising the visualization of the crystalline planes during etching.

2. The piezoelectric resonator according to claim 1, wherein said first fixing zone of the base is fixed to the case by means of a rigid conductive agent.

3. The piezoelectric resonator according to claim 2, wherein the rigid conductive agent is an adhesive agent or a weld.

4. The piezoelectric resonator according to claim 1, wherein said hole has a length comprised between 33 and 75% of the width of the base.

5. The piezoelectric resonator according to claim 1, wherein said hole has a length comprised between 39 and 50% of the width of the base.

6. The piezoelectric resonator according to claim 1, wherein said hole has a width comprised between 10 and 50% of the length of the base.

7. The piezoelectric resonator according to claim 1, wherein said hole has a width comprised between 15 and 25% of the length of the base.

8. The piezoelectric resonator according to claim 1, wherein said third zone of the base has a width comprised between 50 and 200% of the width of an arm.

9. The piezoelectric resonator according to claim 1, wherein said third zone of the base has a width comprised between 80 and 130% of the width of an arm.

10. A piezoelectric resonator, packaged in a case, including a base formed of a first fixing zone, a second central mechanical uncoupling zone and a third zone opposite to the first fixing zone, at least two vibrating arms extending from said third zone, on each of which at least one groove is formed on at least one of the top or bottom faces of the arms, wherein the base is provided with a hole through the second central mechanical uncoupling zone, and wherein said hole has a polygonal shape the sides of which are cut so as to minimise the visualization of the crystalline planes of the piezoelectric resonator.

11. The piezoelectric resonator according to claim 10, wherein the resonator is formed by a quartz crystal and wherein the hole has a polygonal shape at least one angle of which has a value of 60 or 120°.

12. The piezoelectric resonator according to claim 1, wherein each arm includes two straight grooves on each of the bottom and top faces.

13. The piezoelectric resonator according to claim 2, wherein, where the arms are fixed, the third zone has a cut out portion minimising the visualization of the crystalline planes of the piezoelectric resonator.

14. The piezoelectric resonator according to claim 13, wherein the resonator is formed by a quartz crystal and wherein said cut out portion has an angle of 60 or 120°.

15. Vibrator including a case in which a piezoelectric resonator according to claim 1, is fixed, wherein a rigid conductive agent is used as means for fixing the case to the resonator.

16. The piezoelectric resonator according to claim 1, wherein said hole has an octagonal shape having 4 angles of 120° on the side of the lateral flanks of said base the resonator.

17. The piezoelectric resonator according to claim 1, wherein said hole has a hexagonal shape having 2 angles of 60° on the side of the lateral flanks of said base of the resonator.

18. The piezoelectric resonator according to claim 1, wherein said hole has a hexagonal shape having 6 angles of 120°.

\* \* \* \* \*